US011955174B2

(12) United States Patent
Hunter (10) Patent No.: US 11,955,174 B2
(45) Date of Patent: Apr. 9, 2024

(54) SELECTIVELY CONNECTABLE CONTENT-ADDRESSABLE MEMORY

(71) Applicant: Arista Networks, Inc., Santa Clara, CA (US)

(72) Inventor: Callum Hunter, Sydney (AU)

(73) Assignee: ARISTA NETWORKS, INC., Santa Clara, CA (US)

( * ) Notice: Subject to any disclaimer, the term of this patent is extended or adjusted under 35 U.S.C. 154(b) by 452 days.

(21) Appl. No.: 16/802,252

(22) Filed: Feb. 26, 2020

(65) Prior Publication Data

US 2021/0266260 A1 Aug. 26, 2021

(51) Int. Cl.
| | |
|---|---|
| *G11C 15/00* | (2006.01) |
| *G06F 3/06* | (2006.01) |
| *G06F 15/173* | (2006.01) |
| *G11C 7/22* | (2006.01) |
| *G11C 15/04* | (2006.01) |
| *H04L 45/42* | (2022.01) |
| *H04L 45/745* | (2022.01) |
| *H04M 7/12* | (2006.01) |

(52) U.S. Cl.
CPC ............ *G11C 15/00* (2013.01); *G06F 3/0635* (2013.01); *G06F 15/17312* (2013.01); *G11C 7/22* (2013.01); *G11C 15/04* (2013.01); *H04L 45/42* (2013.01); *G06F 15/17331* (2013.01); *H04L 45/74591* (2022.05); *H04M 7/128* (2013.01)

(58) Field of Classification Search
None
See application file for complete search history.

(56) References Cited

U.S. PATENT DOCUMENTS

| | | | | |
|---|---|---|---|---|
| 5,012,434 | A * | 4/1991 | Zietlow | G06T 3/602 |
| | | | | 347/900 |
| 7,853,951 | B2 * | 12/2010 | Rosenbluth | G06F 9/52 |
| | | | | 711/152 |
| 8,754,681 | B2 * | 6/2014 | Zhu | H03L 7/00 |
| | | | | 327/147 |
| 9,053,052 | B1 * | 6/2015 | Schmidt | G06F 12/0207 |
| 9,178,692 | B1 * | 11/2015 | Channabasappa | H04L 7/041 |
| 9,337,931 | B2 * | 5/2016 | Srinivas | H04B 10/27 |
| 9,432,298 | B1 * | 8/2016 | Smith | H04L 49/9057 |
| 9,558,825 | B1 * | 1/2017 | Howard | G06F 12/00 |
| 9,589,008 | B2 * | 3/2017 | Colgrove | G06F 3/0673 |
| 9,727,501 | B2 * | 8/2017 | Gowravaram | G06F 13/28 |
| 9,772,958 | B2 * | 9/2017 | Mogul | H04L 47/10 |
| 10,002,080 | B2 * | 6/2018 | Kass | G06F 12/10 |
| 10,025,734 | B1 * | 7/2018 | Caruso | G06F 3/0631 |

(Continued)

*Primary Examiner* — Henry Tsai
*Assistant Examiner* — Christopher A Bartels
(74) *Attorney, Agent, or Firm* — Fountainhead Law Group P.C.

(57) ABSTRACT

A switching system includes a content-addressable memory (CAM) and several processing nodes. The CAM can be selectively connected to any one or more of the processing nodes during operation of the switching system, without having to power down or otherwise reboot the switching system. The CAM is selectively connected to a processing node in that electrical paths between the CAM and the processing nodes can be established, torn down, and re-established during operation of the switching system. The switching system can include a connection matrix to selectively establish electrical paths between the CAM and the processing nodes.

20 Claims, 12 Drawing Sheets

(56) References Cited

U.S. PATENT DOCUMENTS

| | | | |
|---|---|---|---|
| 10,725,844 B2* | 7/2020 | Dougherty | G11C 11/417 |
| 11,048,435 B2* | 6/2021 | Kim | G06F 3/0679 |
| 2002/0156612 A1* | 10/2002 | Schulter | H04L 67/1097 703/23 |
| 2004/0205292 A1* | 10/2004 | Lu | H04L 45/7453 711/108 |
| 2006/0221832 A1* | 10/2006 | Muller | H04L 67/56 370/235 |
| 2010/0153617 A1* | 6/2010 | Miroshnichenko | G06F 3/061 718/1 |
| 2010/0235663 A1* | 9/2010 | Olsson | G06F 1/3293 713/323 |
| 2012/0137157 A1* | 5/2012 | Olsson | G06F 1/3287 713/324 |
| 2012/0319750 A1* | 12/2012 | Zhu | H03L 7/00 327/159 |
| 2013/0108263 A1* | 5/2013 | Srinivas | H04L 12/28 398/58 |
| 2013/0108264 A1* | 5/2013 | deRuijter et al. | H04Q 3/0083 398/45 |
| 2013/0111077 A1* | 5/2013 | Gowravaram | G06F 13/28 710/22 |
| 2013/0117621 A1* | 5/2013 | Saraiya | H04L 49/356 714/E11.01 |
| 2013/0279909 A1* | 10/2013 | Srinivas | H04B 10/27 398/58 |
| 2014/0281208 A1* | 9/2014 | Fromm | G06F 16/90339 711/108 |
| 2015/0052298 A1* | 2/2015 | Brand | G11C 15/04 711/108 |
| 2016/0261375 A1* | 9/2016 | Roethig | H04L 7/041 |
| 2018/0121277 A1* | 5/2018 | Dougherty | G06F 11/0793 |
| 2018/0137916 A1* | 5/2018 | Salama | G11C 13/0007 |
| 2018/0288126 A1* | 10/2018 | Smart | H04L 69/22 |
| 2019/0289102 A1* | 9/2019 | Goel | H04L 45/74591 |
| 2019/0379770 A1* | 12/2019 | Thantry | H04L 69/22 |
| 2021/0266260 A1* | 8/2021 | Hunter | H04L 49/15 |

* cited by examiner

SELECTIVELY CONNECTABLE CONTENT-ADDRESSABLE MEMORY

BACKGROUND

Network devices typically use some type of content-addressable memory (CAM) to express packet classifiers (packet processing rules) and associated actions when processing packets. The use of CAM technology allows for high throughput processing of packets.

A commonly used type of CAM is a ternary CAM (TCAM). The term "ternary" refers to the memory's ability to store and query data using three different inputs: 0, 1 and X. The "X" input, which is often referred to as a "don't care" or "wildcard" state, enables TCAM to perform broader searches based on pattern matching, as opposed to binary CAM, which performs exact-match searches using only 0's and 1's. TCAM is commonly found in networking equipment, such as high-performance routers and switches, to increase the speed of route look-up, packet classification, packet forwarding and access control list-based commands.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

The present disclosure is directed to selectively connecting a content-addressable memory (CAM) to different data processing elements in order to enhance the functionality of those data processing elements. In one configuration, a crosspoint switch can connect together a CAM and various data processing elements (devices) such as a switch, an FPGA, and so on. A suitable interface can receive control information to reconfigure the crosspoint switch so that the CAM can be connected to one device or another. In some cases, where the CAM is capable of concurrently supporting multiple devices, the crosspoint switch can connect the CAM to more than one device at a time. The reconfiguration can be performed on a live system, without having to shut down the system.

The control information to reconfigure the crosspoint switch can come from a user, an automated script, etc., via a maintenance CPU/platform connected to the crosspoint switch, over a local network, and so on. The control information can come from another computer system so that the CAM can be autonomously connected and reconnected depending on the operational mode and/or function. In some instances, the devices connected to the crosspoint switch themselves can include intelligence to reconfigure the crosspoint switch (e.g., via management CPU 12).

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1A:
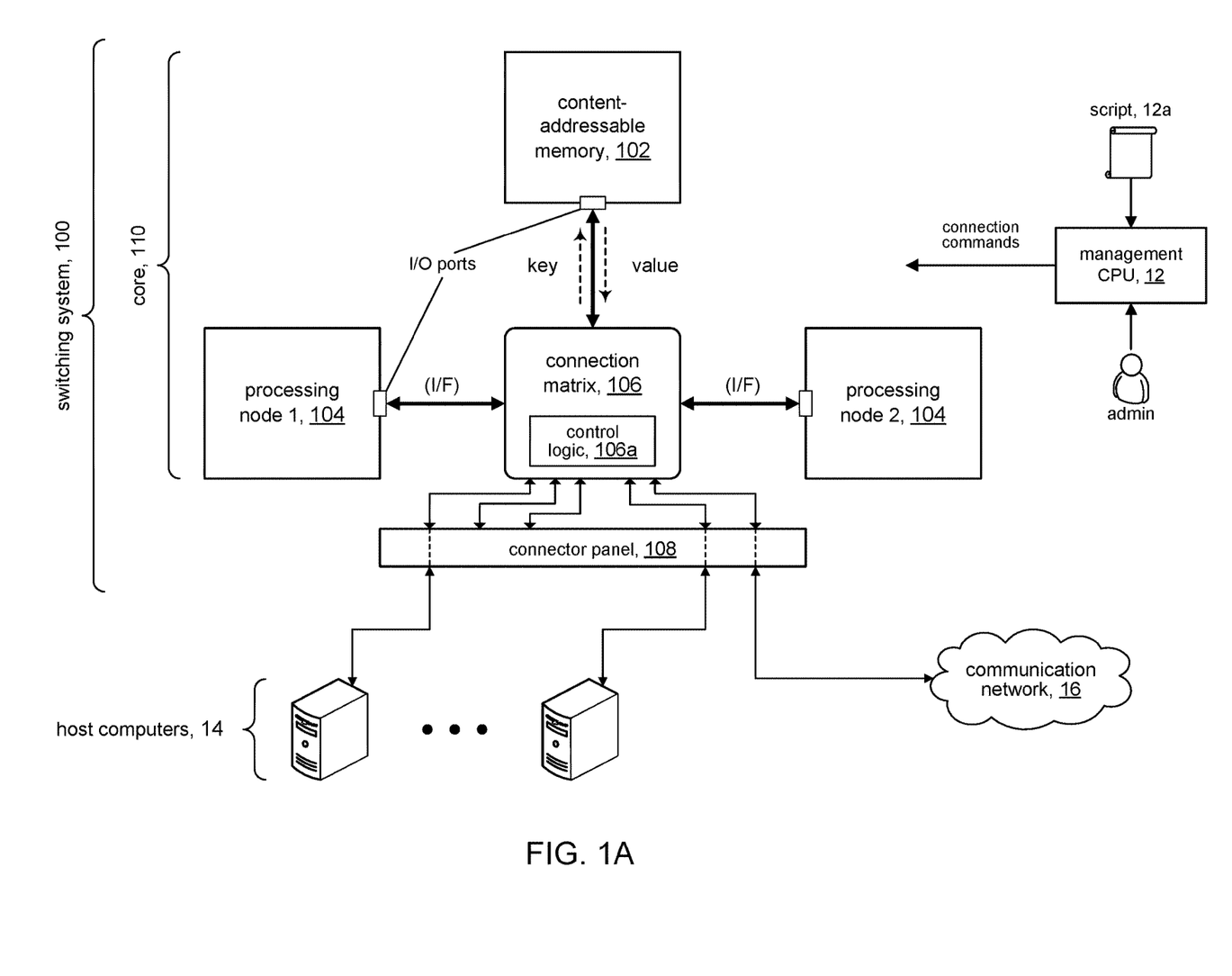
FIG. 1A illustrates a system block diagram of a switching system in accordance with some embodiments.

FIG. 1A illustrates a system block diagram of a switching system that incorporates a content-addressable memory in accordance with the present disclosure. In some embodiments, for example, switching system 100 can include content-addressable memory (CAM) 102. A content-addressable memory is memory lookup structure that is designed for fast memory lookups. CAM 102 can be any suitable content-addressable memory architecture such as a ternary CAM (TCAM) or the like. In some embodiments, CAM 102 can include a combination of content addressable memory and/or enhanced content search algorithms. It will be appreciated that in other embodiments, memory lookup structures other than a CAM can be used.

Typically, the input to CAM 102 is referred to as a "key" and the CAM output is a "value" associated with that key. The key and value can be simple data values or can comprise structured data. This configuration allows for CAM 102 to be a high capacity, high performance device that can be shared among several processing nodes 104 comprising system 100. A shareable CAM can improve performance in system 100 in terms of power usage, reduced circuit complexity, and overall system cost.

System 100 can include various processing nodes 104 that use CAM 102. Although system 100 shows two processing nodes, processing node 1 and processing node 2, it is understood that in other embodiments, a system can include additional processing nodes. Processing nodes 104 can include device-level elements such as switches and routers, or component-level elements such as central processing units (CPUs), Advanced RISC Machines (ARMs), custom programmed field programmable gate arrays (FPGAs), digital signal processors (DSPs), application specific ICs (ASICs), and so on. By being able to share CAM 102, system 100 enables processing nodes 104 to benefit from having a high-performance CAM without requiring that each processing node have its own dedicated CAM.

System 100 can include connection matrix 106, also known as a crosspoint switch or a crossbar switch. I/O ports on CAM 102 and processing nodes 104 can be connected to I/O ports provided on connection matrix 106 via suitable interfaces (I/F). The interfaces that connect CAM 102 and processing nodes 104 to connection matrix 106 can be any suitable data bus architecture, including but not limited to serial or parallel data buses using standard interfaces such as the Interlaken data protocol developed by Cortina Systems Inc. and Cisco Systems Inc., or other proprietary protocols.

In accordance with the present disclosure, connection matrix 106 can selectively connect, disconnect, and re-connect electrical paths between CAM 102 and processing nodes 104 that comprise system 100. In some embodiments, for example, system 100 can include management CPU 12 that a user (e.g., system administrator) can use to configure connection matrix 106. For example, commands can be entered to management CPU 12 via a console (not shown) connected to the management CPU or via a computer connected to the front panel. Management CPU 12 can communicate connection commands to connection matrix 106 to configure, selectively establish, or otherwise define one or more electrical paths between CAM 102 and processing nodes 104 during the course of operation of the switching system.

In some embodiments, connection matrix 106 can include control logic 106a configured to receive connection commands (e.g., via a maintenance port, not shown) and establish electrical paths according to the received connection commands. Examples of illustrative connection configurations are described below. Connection commands to configure connection matrix 106 can come from a system administrator using the management CPU. In some embodiments, script 12a running on management CPU 12 can issue connection commands. For example, script 12a may configure connection matrix 106 to connect CAM 102 to processing node 1 during certain hours of the day and to processing node 2 at other times. Although not shown, in some embodiments, processing nodes 104 can also configure connection matrix 106 via management CPU 12.

Connector panel 108 can provide host computers 14 with access to system 100. Connector panel 108 can connect hosts computers 14 to connection matrix 106 (e.g., via management CPU 12) and hence to processing nodes 104 in order to access functionality, such as packet switching, provided by processing nodes 104. In some embodiments, connector panel 108 can comprise Ethernet ports and/or other suitable interfaces that host computers 14 can connect to in order to communicate with processing nodes 104.

System 100 can access communication network 16 via connector panel 108, allowing the switching system to access the network. Communication network 16 can represent any data network, including but not limited to a local area network (LAN), wide area network (WAN), virtual LAN (VLAN), public switched telephone network (PSTN), and the like.

Figure 1B:
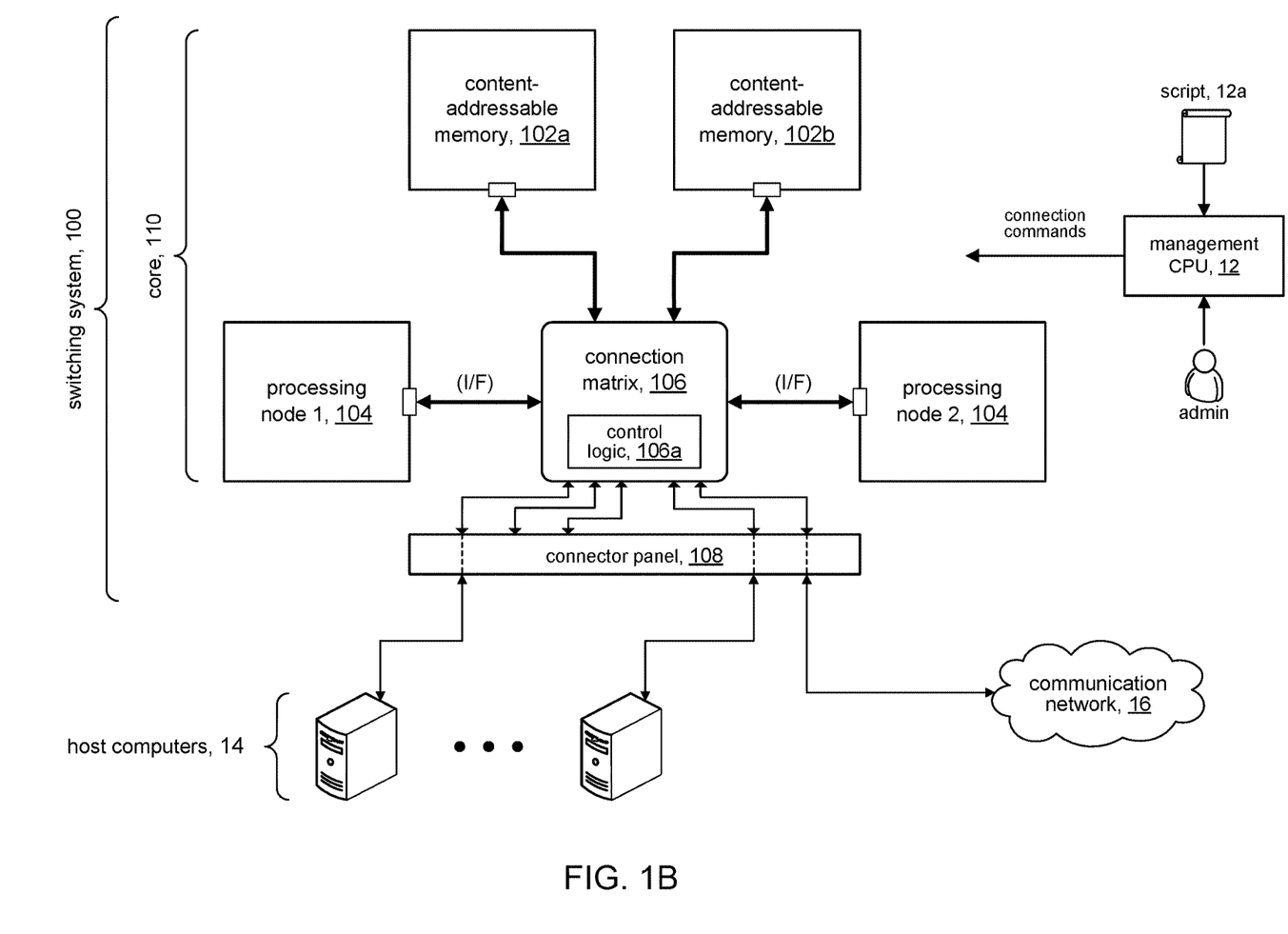
FIG. 1B illustrates a system block diagram of a switching system in accordance with some embodiments.

FIG. 1A illustrates a configuration of system 100 having a single CAM 102. It will be appreciated, however, that in other embodiments, system 100 can be configured with multiple CAMs. FIG. 1B, for example, shows a configuration of system 100 having CAMs 102a, 102b.

Figure 1C:
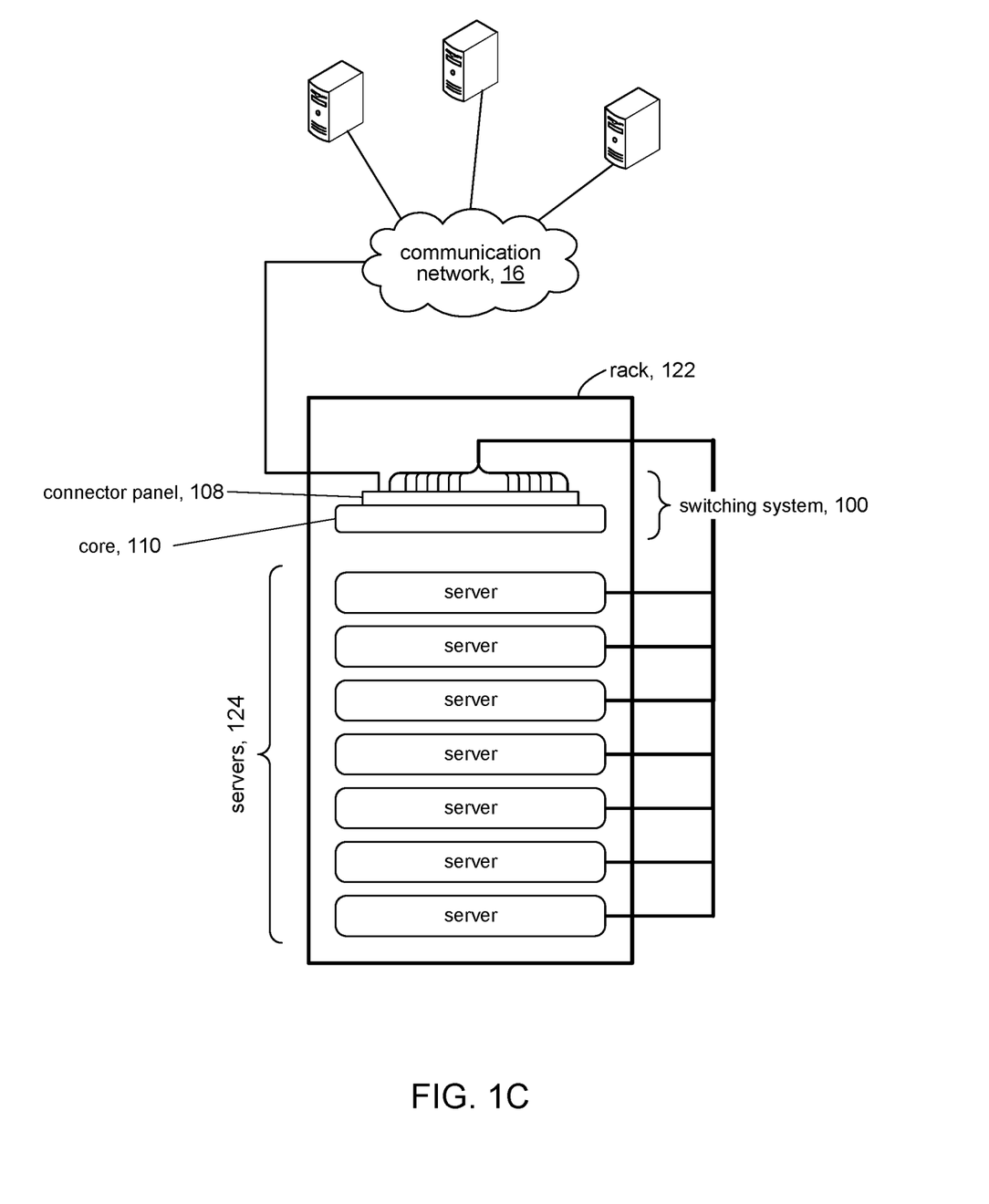
FIG. 1C illustrates a system block diagram of a server rack in accordance with some embodiments.

FIG. 1C illustrates an example of switching system 100 configured in a server rack. In some embodiments, for example, switching system 100 can be the switching component in server rack 122 comprising servers 124, with the switching system arranged at the top of the server rack in a so-called top-of-rack configuration (although other physical arrangements are possible). In some embodiments, core 110 of the switching system can include CAM 102, connection matrix 106, and processing nodes 104 shown in FIG. 1A. Connector panel 108 connects servers 124 to core 110. Connector panel 108 also provides access to communication network 16 (e.g., local area network, wide-area network, the Internet, etc.). As noted in FIG. 1A, connection matrix 106 can be configured via a management CPU 12 to selectively establish one or more electrical paths between CAM 102 and processing nodes 104 during the course of operation of the servers.

Figure 2:
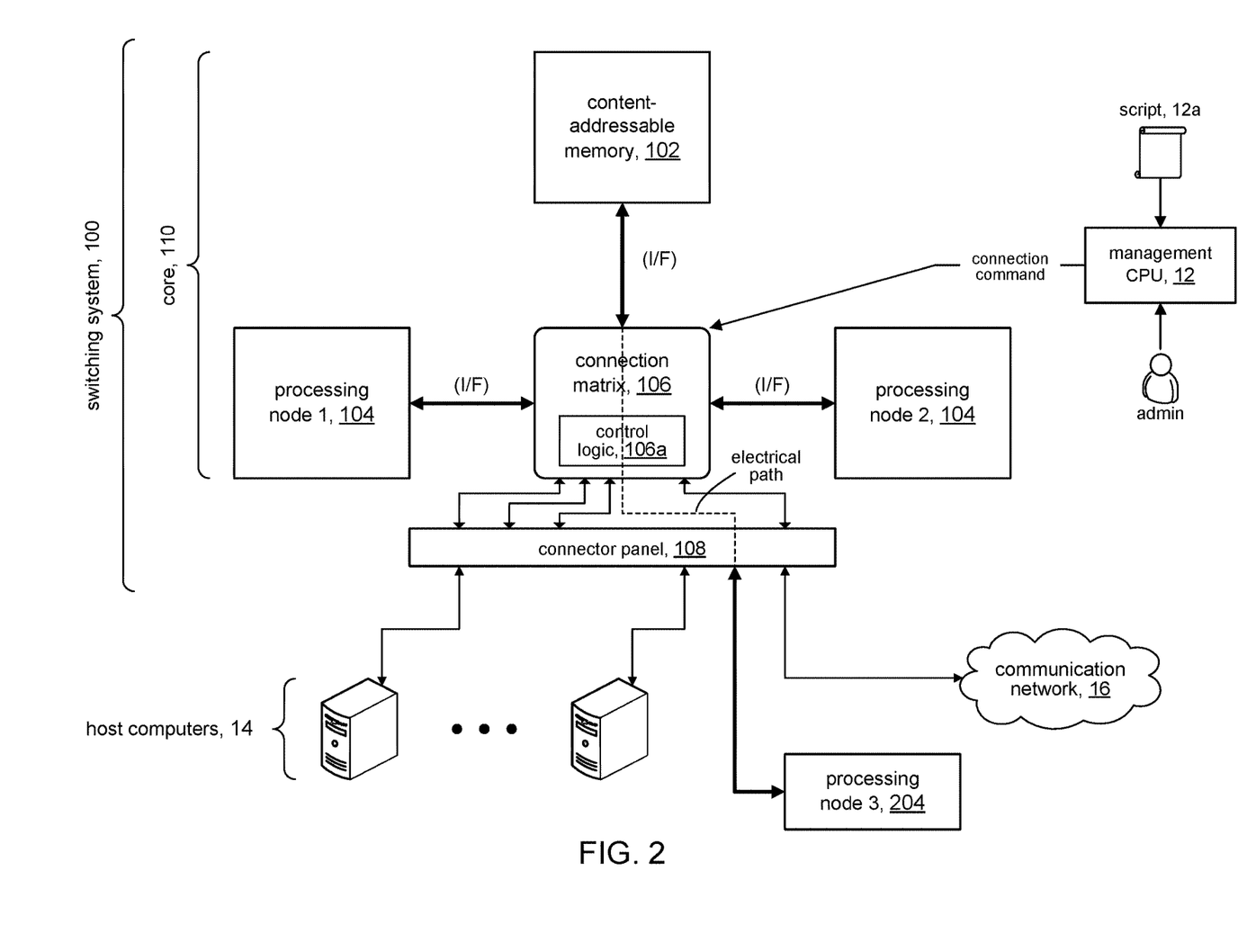
FIG. 2 illustrates a system block diagram of a switching system in accordance with some embodiments.

Referring to FIG. 2, in accordance with some embodiments of the present disclosure, CAM 102 can be connected to a processing node separate from system 100. FIG. 2, for example, shows that processing node 204, which is separate from system 100, can be connected to a port on connector panel 108. Connection matrix 106 can then be configured to provide a data patch between CAM 102 and processing node 204 via connector panel 108, providing the processing node with access to CAM 102.

Figure 3:
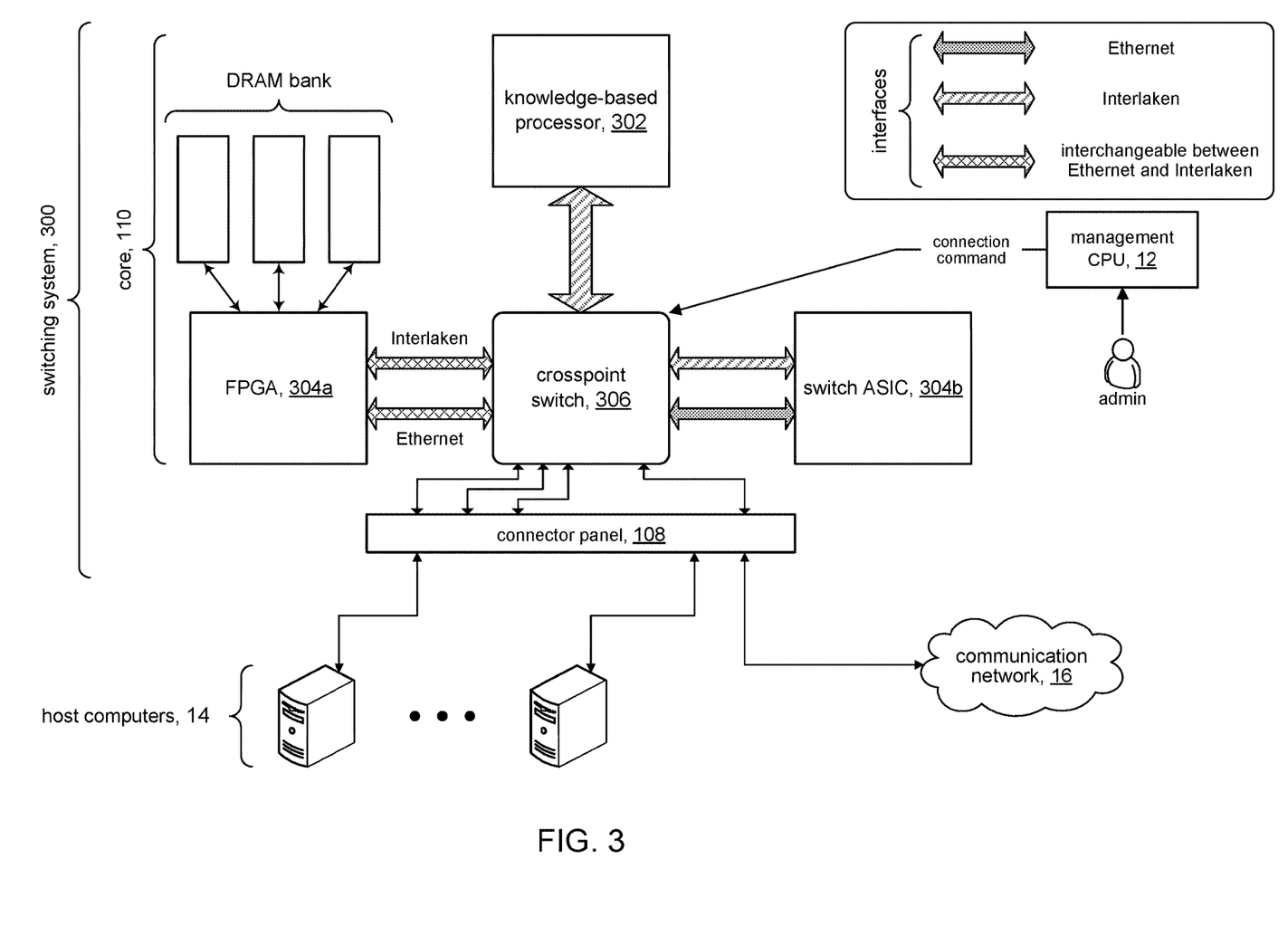
FIG. 3 illustrates a system block diagram of a switching system in accordance with a specific example.

FIG. 3 shows a specific embodiment of a switching system in accordance with the present disclosure. As an illustrative example, for instance, switching system 300 can include knowledge-based processor (KBP) 302 by Broadcom Limited as an example of a content-addressable memory. An example of a processing node is FPGA 304a configured with custom programming for a specific application(s) (e.g., packet switching/pattern matching) such as can be provided by Arista, Inc., a manufacturer of FPGA-enabled network solutions. FPGA 304a can be configured with a bank of dynamic random-access memory (DRAM) to support application(s) running on the FPGA. Switch ASIC 304b is another example of a processing node, which can be programmed to provide basic packet switching functionality. An example of a connection matrix is crosspoint switch 306, such as can be provided by MACOM Technology Solutions Inc., although other known connection matrix products are equally suitable.

As mentioned in connection with FIG. 1A, elements comprising system 100 can be connected by any suitable interface. FIG. 3, for example, shows that the interface between KBP 302 and crosspoint switch 306 can be a serial interface that supports the Interlaken interconnect protocol, which is graphically represented in the figure by hatching lines. The interface between switch ASIC 304b and crosspoint switch 306 can include an Ethernet interface, which is depicted in FIG. 3 by shading, and the Interlaken interface. The Ethernet interface can support communication with host computers 14 and communication network 16, while the Interlaken interface can support communication with KBP 302. The interface for FPGA 304a is interchangeable in that the interface can be configured (e.g., by suitably programming the FPGA) to work with other interfaces. FIG. 3, for example, shows that some of the data lines of the FPGA interface are configured to run as Ethernet and other data lines are configured to run as Interlaken. In other applications, the FPGA interface can be configured to run other interfaces such as Serial Advanced Technology Attachment (SATA), Peripheral Component Interconnect Express (PCI-e), and so on.

Figure 4:
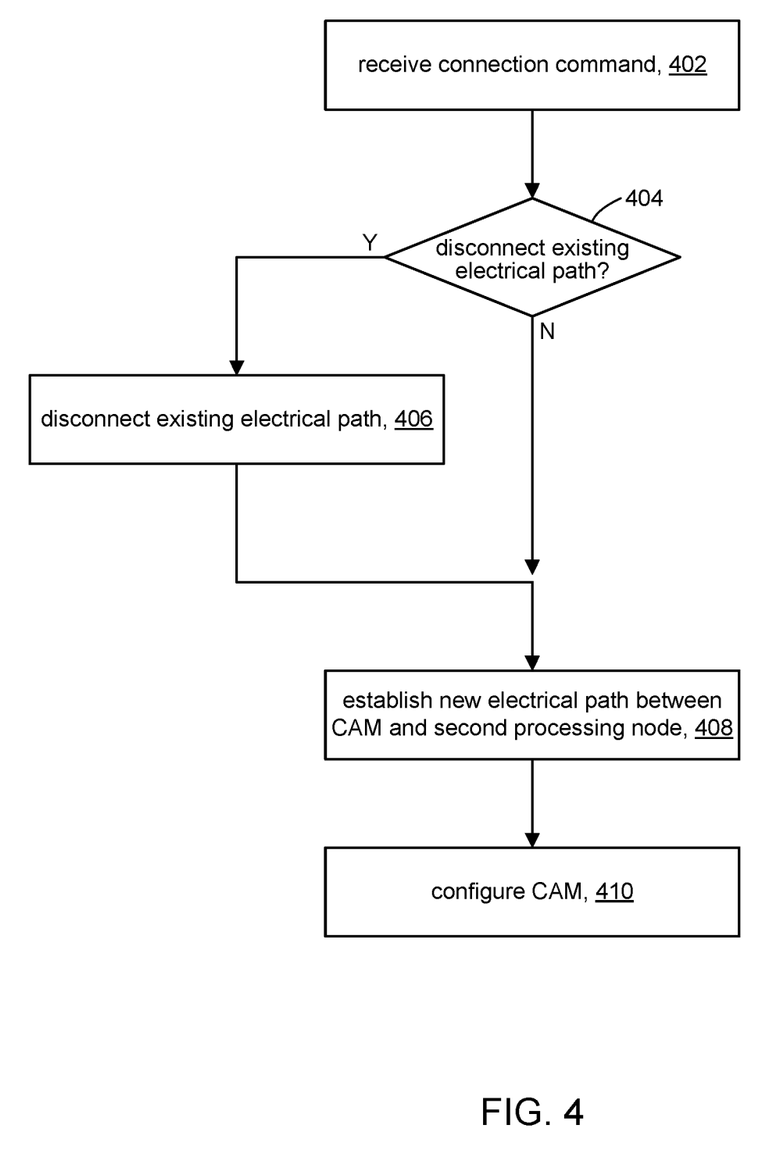
FIG. 4 illustrate operation of a switching system in accordance with some embodiments.

Referring to FIG. 4, the discussion will now turn to a high level description of operations in switching system 100 in accordance with the present disclosure. In some embodiments, for example, control logic 106a in connection matrix 106 may be configured to perform operations shown in FIG. 4. For discussion purposes, suppose the switching system is currently configured with an existing (first) electrical path between CAM 102 and a first processor (e.g., processing node 1).

At operation 402, the control logic receives a connection command to reconfigure the switching system. For example, suppose a user had previously configured the connection matrix to establish an electrical path between CAM 102 and a processing node 1. Suppose, at a subsequent time, the user wanted to connect CAM 102 to processing node 2 for special processing. Accordingly, a system administrator can alter the electrical path configuration that is set up in the connection matrix depending on the user needs via management CPU 12. In some embodiments, for example, the connection command can identify two elements in the switching system to define or otherwise establish an electrical path in the connection matrix between the two elements. The connection command can specify elements that are directly connected to the connection matrix, such as CAM 102 and processing nodes 104 shown in FIG. 1A. In other instances, the connection command can specify elements that are connected to the connector hub, such as processing node 204 shown in FIG. 2.

At operation 404, the control logic determines whether to disconnect an already existing (first) electrical path between the CAM and a (first) processing node. For example, a system administrator, may want to redirect the CAM to processing node 2. The connection command can indicate to disconnect the electrical path between CAM 102 and processing node 1 and establish a (second) electrical path between the CAM and (second) processing node 2. Alternatively, the system administrator may want to establish a second electrical path in addition to the first electrical path. The connection command can indicate to define/create an electrical path between the CAM and processing node 2 without taking down the electrical path between CAM 102 and processing node 1. If the first electrical path is to be disconnected (taken down), processing can proceed to operation 406. If the first electrical path is to be retained, processing can proceed to operation 408.

At operation 406, the control logic disconnects an already existing (first) electrical path between the CAM and a (first) processing node.

At operation 408, the control logic controls switching circuitry (not shown) in the connection matrix to connect CAM 102 to processing node 2 by defining an electrical path in the connection matrix between the CAM and processing node, allowing the processing node to access data stored in the CAM.

At operation 410, the control logic configures the CAM in preparation for operation with the second processing node. For example, suppose the CAM is initially loaded with packet processing rules (also known as ACLs, access control lists) for operation with a packet processor (first processor). In one use case, for example, another packet processor may connect to the CAM, where additional rules may need to be loaded (stored) into the CAM. In another use case, a specialized processor for performing a different application (e.g., specialized pattern matching) may be connected to the CAM. Previously downloaded data tables in the CAM may need to be replaced with new data tables that are suitable for the new application. These use cases are merely illustrative and other use cases can be accommodated.

Figure 5A:
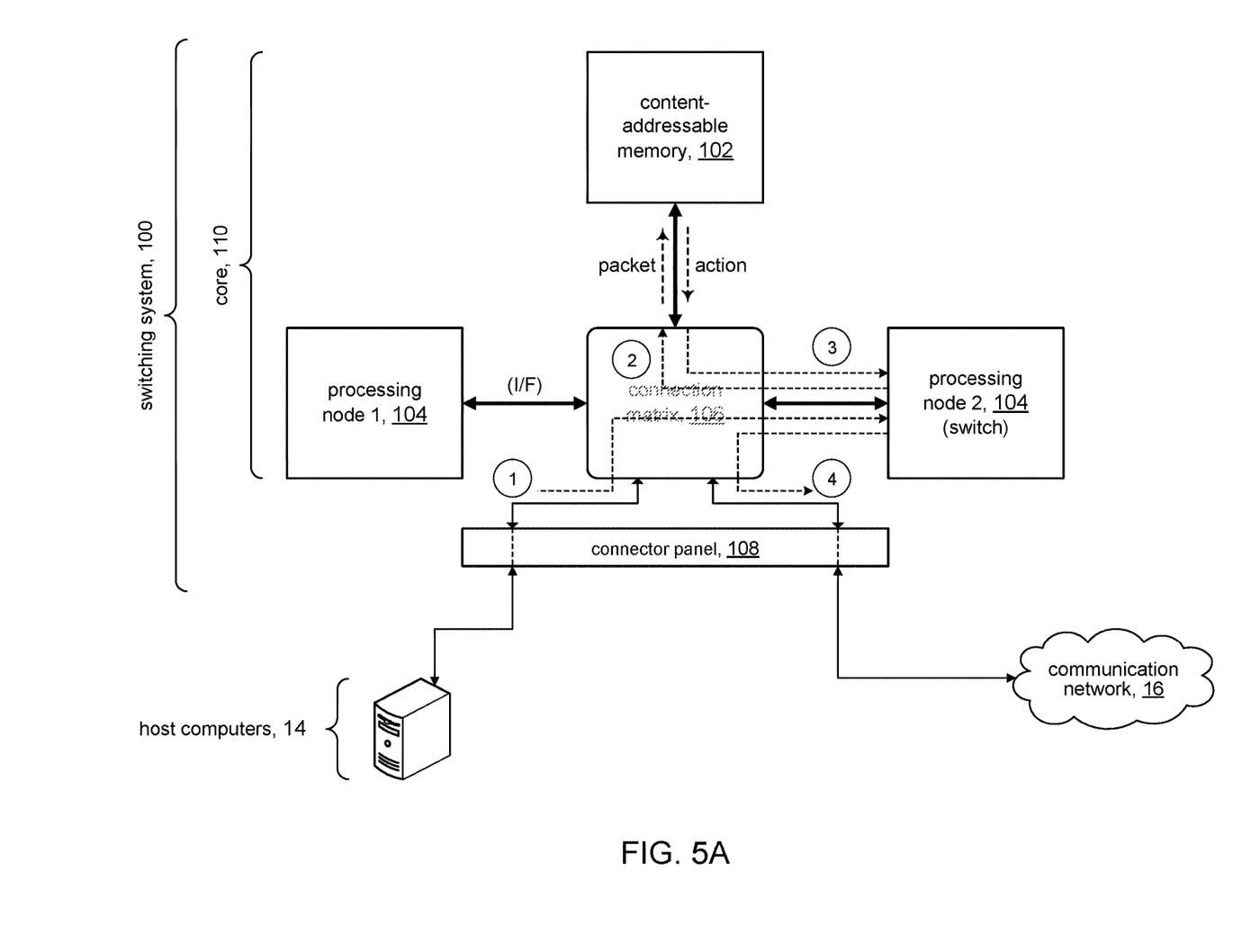
FIGS. 5A and 5B illustrate selectively establishing electrical paths in accordance with some embodiments.

FIG. 5A shows an example of data flows in an illustrative configuration of electrical paths in connection matrix 106. Suppose for discussion purposes that processing node 2 is a switch for forwarding Ethernet packets, ignoring processing node 1 for the moment. The figure shows that connection matrix 106 is configured with several electrical paths. An electrical path is configured between a host computer 14 and processing node 2, another electrical path is configured between communication network 16 and the processing node 2, and yet another electrical path is configured between CAM 102 and the processing node 2. The data flow example is described in connection with time indices indicated in the figure by the circled numbers. At time '1', the host computer transmits a packet to processing node 2 (switch). At time '2', the switch can transmit the packet to CAM 102 to identify an action (if any) to be applied in connection with the packet, such as dropping the packet, re-routing the packet, logging, etc. At time '3', CAM 102 can transmit a suitable action response to the switch, where the packet can be processed (or not) according to the action response. At time '4', the switch can forward the packet over an egress port of the switch, for example, onto communication network 16.

Figure 5B:
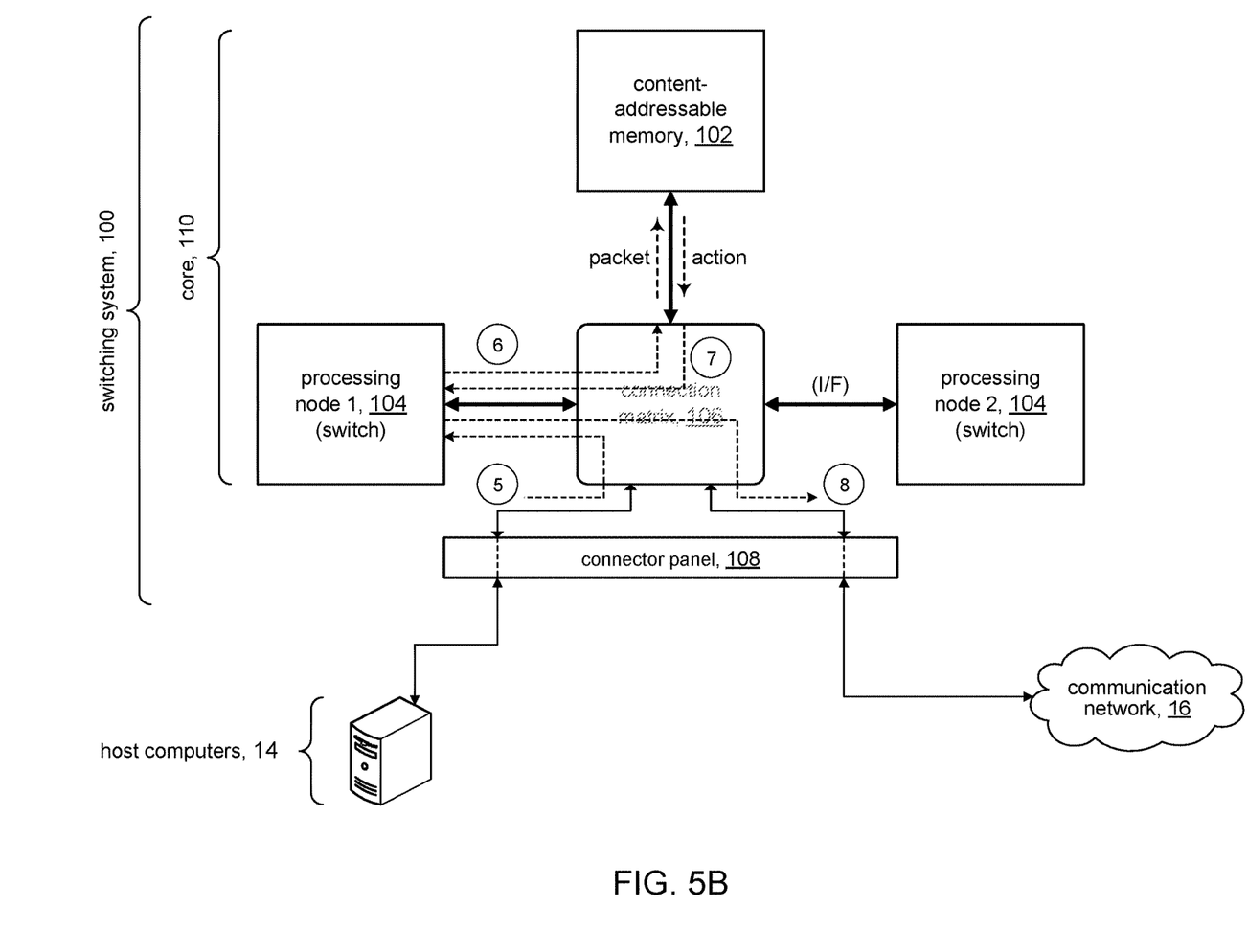

FIG. 5B shows that the electrical paths in the connection matrix can be re-configured at a time subsequent to time '4' in FIG. 5A. Here, the figure shows an electrical path established between the host computer and processing node 1, another electrical path is configured between communication network 16 and processing node 1, and yet another electrical path is configured between CAM 102 and processing node 1. At time '5', the host computer transmits a packet to processing node 1 (switch). At time '6', the switch can transmit the packet to CAM 102 to identify an action (if any) to be applied in connection with the packet, such as blocking, re-routing, logging, etc. At time '7', CAM 102 can transmit a suitable action response to the switch, where the packet can be processed (or not) according to the action response. At time '8', the switch can forward the packet over an egress port of the switch, for example, onto communication network 16.

Figure 6A:
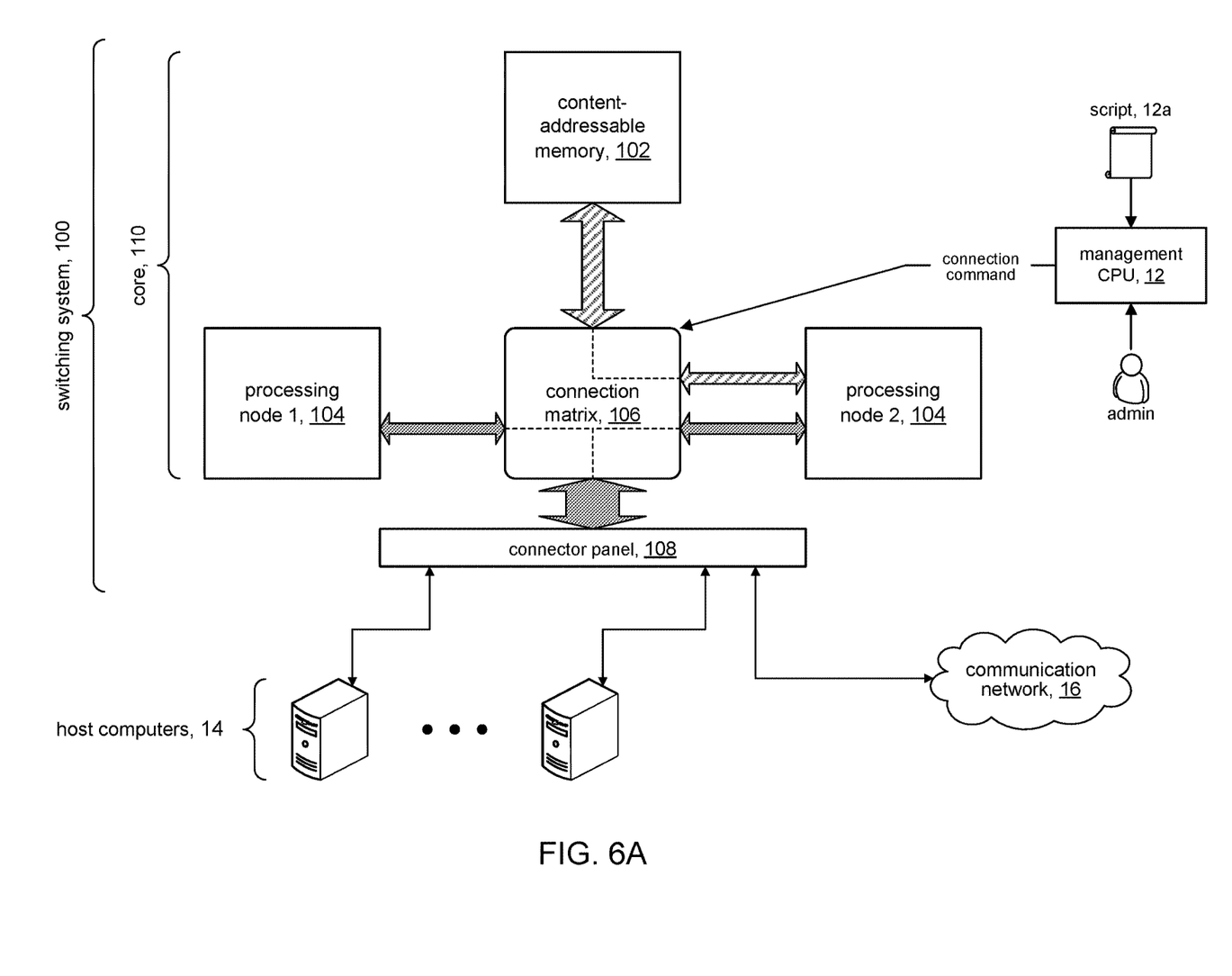
FIGS. 6A, 6B, 6C, 6D depict illustrative, though not exhaustive, examples of configurations in accordance with some embodiments.
Figure 6B:
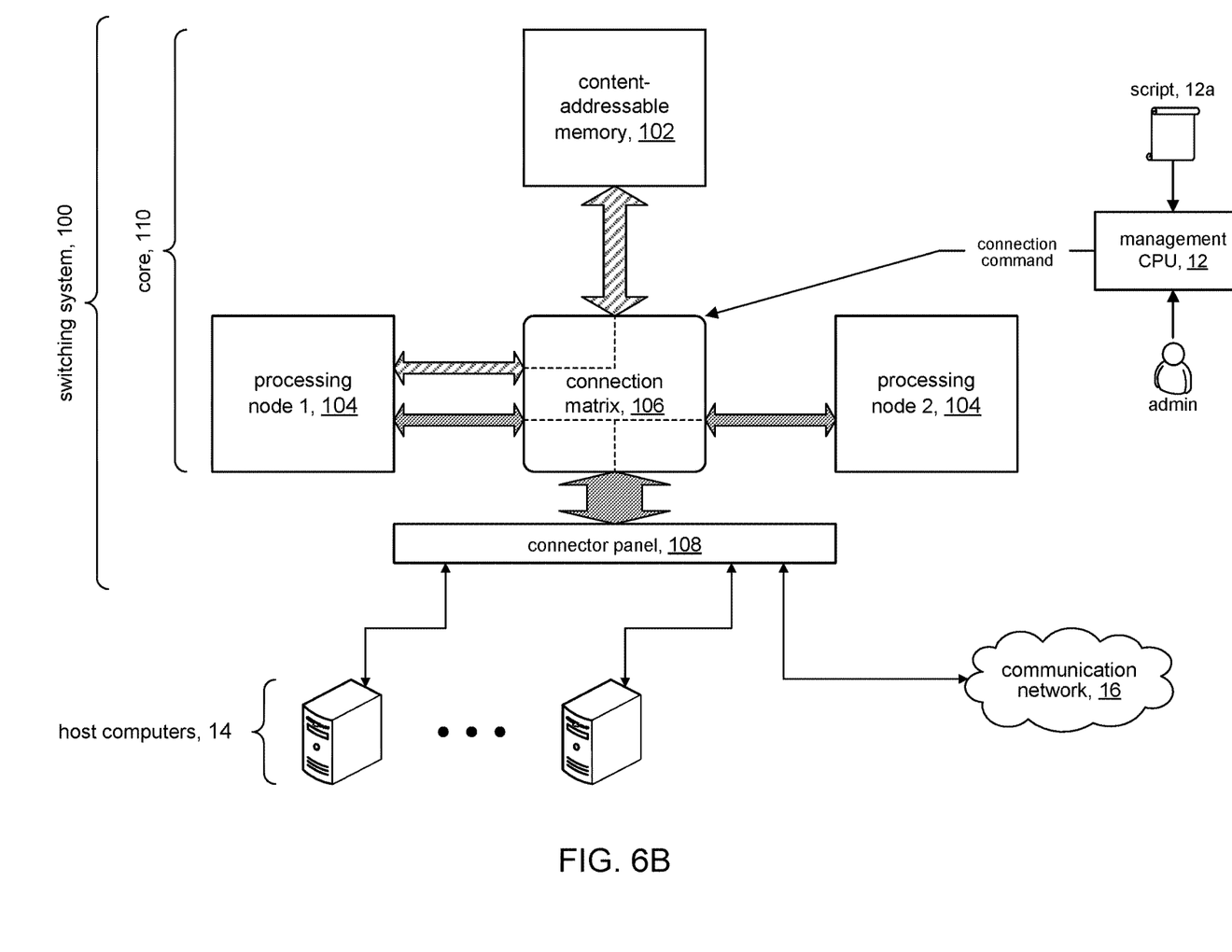

The discussion will now turn to some illustrative configurations of the components comprising core 110 in switching system 100. The configurations shown in FIGS. 6A-6D are illustrative; it will be understood that in other embodiments, additional processing nodes can be included, one or more additional CAMs can be included. In some embodiments, on or more additional connection matrices can be included to provide additional configurations. The figures further illustrate the selectivity between configurations. For example, at one moment, switching system 100 may be configured as shown in FIG. 6A. At another moment, switching system 100 may be re-configured as shown in FIG. 6B, for example, via commands from management CPU 12. Notably, connection matrix 106 allows for CAM 102 to be selectively connected to one or more processing nodes without requiring the processing nodes to power down or otherwise be rebooted. Using suitable handshaking signals, connection matrix 106 can selectively connect CAM 102 without interrupting ongoing processing in the processing nodes.

FIG. 6A shows a configuration in which CAM 102 is selectively connected to processing node 2, allowing processing node 2 to access data in CAM 102. The figure also shows that processing nodes 1 and 2 are connected to connector panel 108 in order communicate with host computers 14 and communication network 16. As an illustrative use case, processing node 2 can be a packet switch that uses CAM 102 to store rules (e.g., TCAM rules) for processing packets.

FIG. 6B shows that CAM 102 can be selectively disconnected from processing node 2 and connected to processing node 1.

Figure 6C:
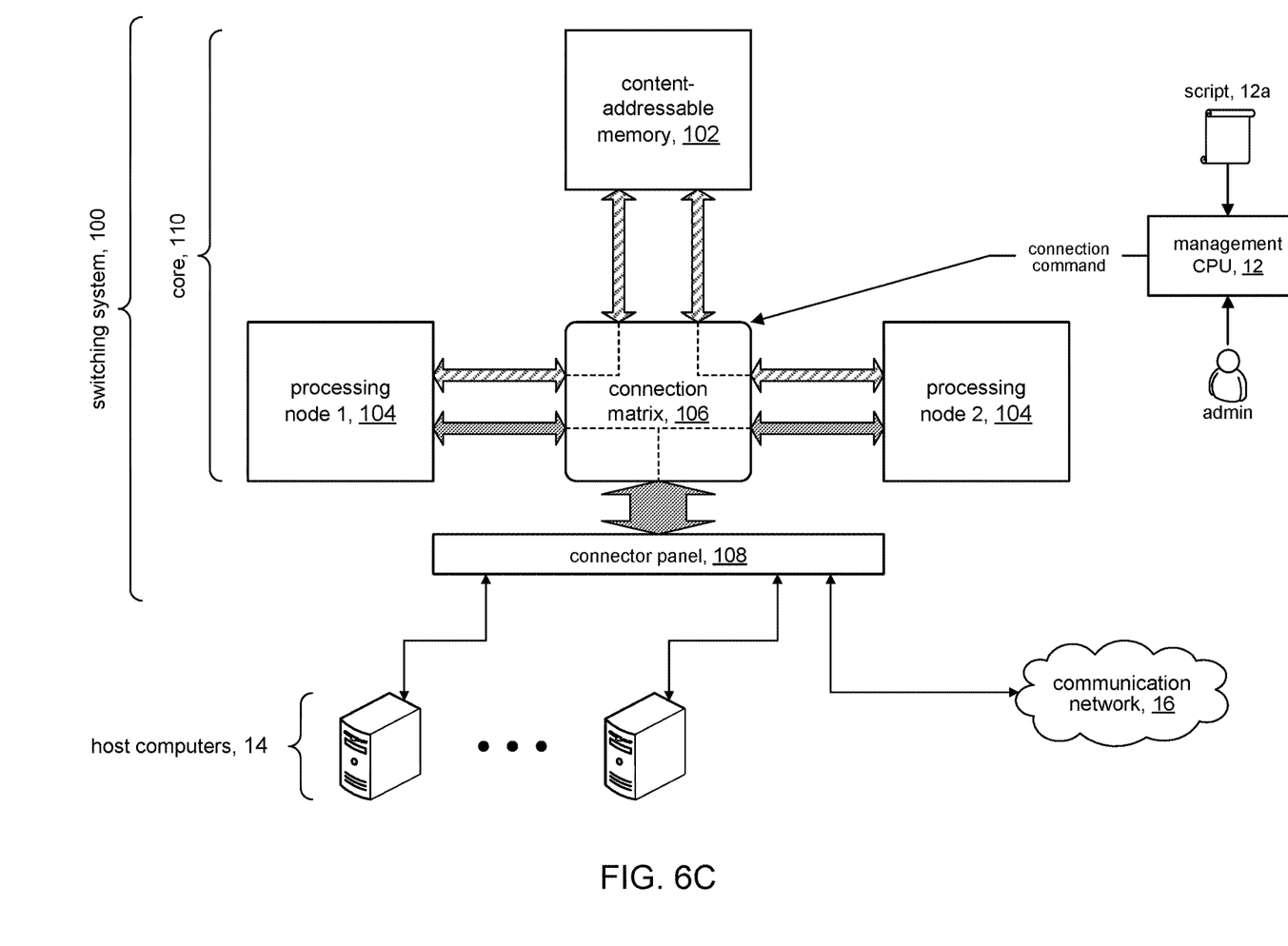

FIG. 6C shows that CAM 102 can be selectively connected to processing nodes 1 and 2 allowing both processing nodes to access content stored in the CAM.

Figure 6D:
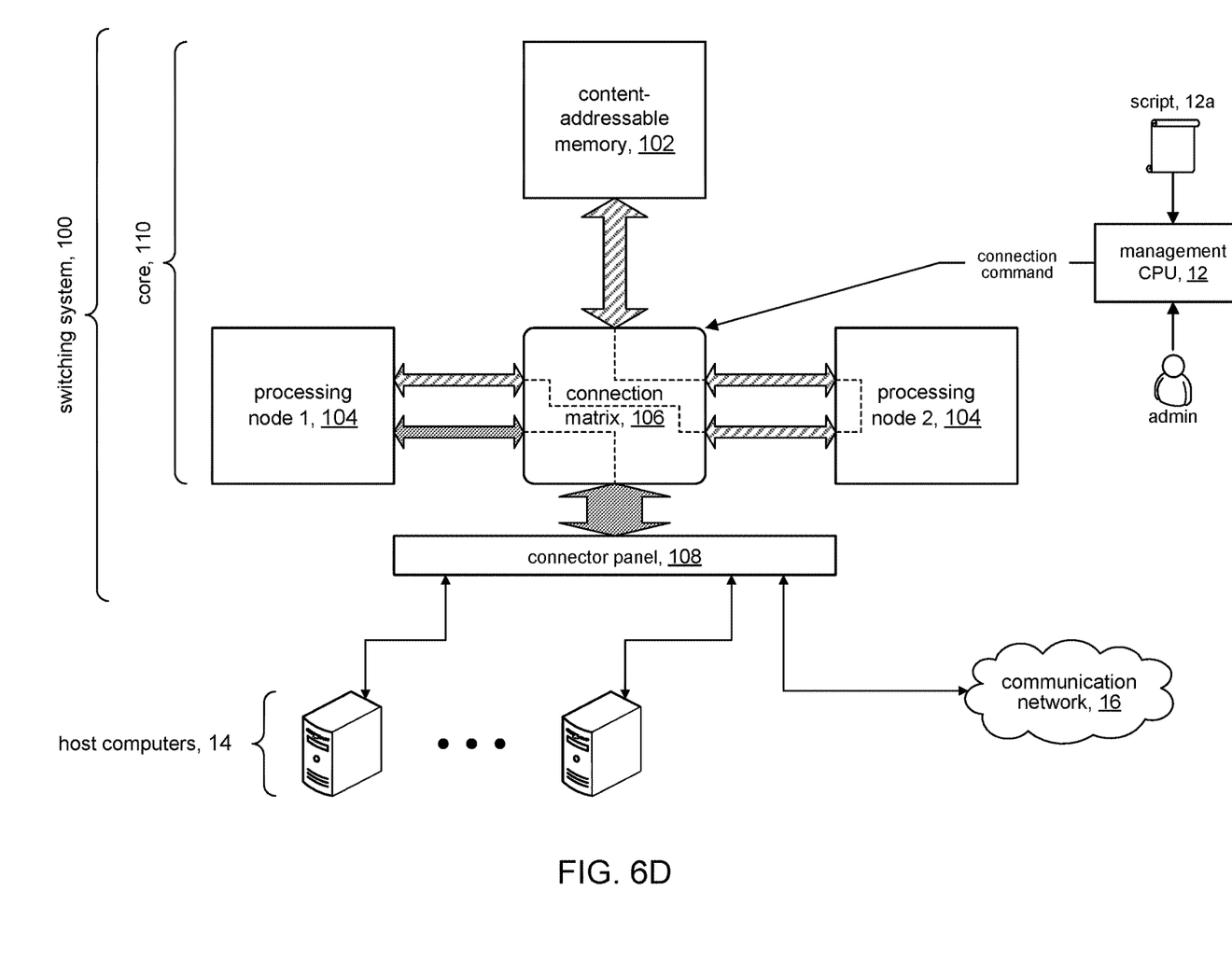

FIG. 6D shows a configuration that allows processing node 1 to access CAM 102 via processing node 2. For example, packets from processing node 1 can be processed in processing node 2 before entering CAM 102. The output of CAM 102 can likewise be processed by processing node 2 before being forwarded to processing node 1. This configuration allows for additional processing to be performed by processing node 2. In some embodiments, for instance, processing node 2 can perform caching of data from CAM 102. When a packet from processing node 1 is forwarded to CAM 102, data retrieved by CAM 102 can be cached in processing node 2. When processing node 1 sends the same packet, processing node 2 can immediately respond to processing node 1 with the previously retrieved data without having to go to the CAM, thus increasing the response speed.

Further Examples

In accordance with some embodiments of the present disclosure, a method can include establishing a first electrical path between a content-addressable memory and a first data processing unit (DPU) from among a plurality of DPUs. In accordance with the method, data can be exchanged between the content-addressable memory and the first DPU along the first electrical path. A control input can be received, and in response, a second electrical path can be established between the content-addressable memory and a second DPU from among the plurality of DPUs. Data can be exchanged between the content-addressable memory and the second DPU along the second electrical path, wherein one or more electrical paths are selectively established between the content-addressable memory and any of the plurality of DPUs.

In some embodiments, the method can further include, in response to receiving the control input, disconnecting the first electrical path. The method can further include storing new data in the content-addressable memory subsequent to establishing the second electrical path between the content-addressable memory and the second DPU.

In some embodiments, the first electrical path remains established in addition to the second electrical path. In some embodiments, the method can further include, storing additional data in the content-addressable memory subsequent to establishing the second electrical path between the content-addressable memory and the second DPU.

In some embodiments, the method can further include, receiving the control input from a computer system separate from the plurality of DPUs.

In accordance with some embodiments of the present disclosure, an apparatus can include a content-addressable memory having inputs and outputs, a plurality of processing nodes, each node having inputs and outputs, a connection matrix having connections to the inputs and outputs of the content-addressable memory and connections to the inputs and outputs of each of the plurality of processing nodes; and an interface in communication with the connection matrix. In response to input from the interface, the connection matrix selectively provides an electrical path between the content-addressable memory and at least one of the plurality of processing nodes.

In some embodiments, in response to input from the interface, the connection matrix disconnects a previous electrical path provided between the content-addressable memory and a first one of the processing nodes and provides a subsequent electrical path between the content-addressable memory and a second one of the processing nodes. In some embodiments, the apparatus can further include, subsequent to providing the electrical path between the content-addressable memory and the second processing node, storing new data in the content-addressable memory.

In some embodiments, wherein in response to input from the interface, the connection matrix can retain a previous electrical path provided between the content-addressable memory and a first one of the processing nodes and provide an additional electrical path between the content-addressable memory and a second one of the processing nodes. In some embodiments, the apparatus can further include, subsequent to providing the additional electrical path between the content-addressable memory and the second processing node, storing additional data in the content-addressable memory.

In some embodiments, wherein in response to input from the interface, the connection matrix connects the content-addressable memory to both a first one of the processing nodes and at least a second one of the processing nodes.

In accordance with some embodiments of the present disclosure, a server rack can include a plurality of servers, a core comprising a memory lookup structure, a plurality of processing nodes, and a connection matrix, and a connector panel connected to the servers and to the core to provide electrical paths between the servers and the processing nodes in the core. The connection matrix can be connected to the memory lookup structure and to the processing nodes, the connection matrix can selectively provide electrical paths between the memory lookup structure any of the processing nodes in response to the connection matrix receiving control input.

In some embodiments, the connection matrix, in response to the control input, provides a first electrical path between the memory lookup structure and a first one of the processing nodes and a second electrical path between the memory lookup structure and a second one of the processing nodes.

In some embodiments, the connection matrix, in response to the control input, the connection matrix disconnects a previous electrical path provided between the memory lookup structure and a first one of the processing nodes and provides a subsequent electrical path between the memory lookup structure and a second one of the processing nodes. In some embodiments the server rack, subsequent to providing the electrical path between the memory lookup structure and the second processing node, storing new data in the memory lookup structure.

In some embodiments, the connection matrix, in response to the control input, the connection matrix retains a previous electrical path provided between the memory lookup structure and a first one of the processing nodes and provides an additional electrical path between the memory lookup structure and a second one of the processing nodes. In some embodiments the server rack, subsequent to providing the electrical path between the memory lookup structure and the second processing node, storing additional data in the memory lookup structure.

In some embodiments, the connection matrix receives control input from a computer system separate from the plurality of servers.

In some embodiments, the memory lookup structure is a content-addressable memory.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A method for selectively connecting a content-addressable memory (CAMs) to different data processing units, said method comprising:
receiving a first control input to connect a CAM to a first data processing unit (DPU) from among a plurality of DPUs via a connection matrix;
the connection matrix establishing a first directly connected electrical path between the CAM and the first DPU, in response to the first control input, wherein the first directly connected electrical path comprises a first data bus that connects the CAM to the connection matrix and a second data bus that connects the connection matrix and the first DPU;
exchanging data between the CAM and the first DPU along the first electrical path;
receiving a second control input to connect the CAM to a second DPU from among the plurality of DPUs via the connection matrix;
in response to receiving the second control input, the connection matrix:
disconnecting the first directly connected electrical path between the CAM and the first DPU; and
establishing a second directly connected electrical path between the CAM and the second DPU, wherein the second directly connected electrical path comprises the first data bus that connects the CAM to the connection matrix and a third data bus that connects the connection matrix to the second DPU; and
exchanging data between the CAM and the second DPU along the second directly connected electrical path,
wherein one or more directly connected electrical paths are selectively established between the CAM and any of the plurality of DPUs via the connection matrix.

2. The method of claim 1, further comprising:
in response to receiving the second control input, re-establishing the first directly connected electrical path in addition to the second directly connected electrical path.

3. The method of claim 2, further comprising storing additional data in the CAM subsequent to re-establishing the second directly connected electrical path between the CAM and the second DPU.

4. The method of claim 1, further comprising receiving the first and second control inputs from a computer system separate from the plurality of DPUs.

5. The method of claim 1, further comprising programming packet processing rules into the CAM by the first DPU, the second DPU, or both.

6. The method of claim 1, further comprising rewriting the CAM for different functions by the first DPU, the second DPU, or both.

7. The method of claim 1, wherein the CAM stores packet processing rules, the first DPU is a first packet processor, and the second DPU is a second packet processor.

8. An apparatus for selectively connecting memory to processing nodes, said apparatus comprising:
a content-addressable memory (CAM) having an interface;
a plurality of processing nodes, each node having an interface;
a connection matrix;
a first data bus that connects the connection matrix to the interface of the CAM;
a plurality of additional data buses, wherein each additional data bus connects the connection matrix to the interface of one of the plurality of processing nodes; and
a control interface in communication with the connection matrix,
wherein, in response to receiving a first control input from the control interface, the connection matrix establishes a first electrical path between the CAM and a first processing node among the plurality of processing nodes,
wherein in response to receiving a second control input from the control interface, the connection matrix disconnects the first electrical path between the CAM and the first processing node and establishes a second electrical path between the CAM and a second processing node among the plurality processing nodes.

9. The apparatus of claim 8, further comprising, subsequent to establishing the second electrical path between the CAM and the second processing node, storing new data in the CAM.

10. The apparatus of claim 8, wherein in response to receiving a third control input from the control interface, the connection matrix re-connecting the electrical path provided between the CAM and the first processing node.

11. The apparatus of claim 8, wherein packet processing rules are programmed into the CAM by at least one of the plurality of processing nodes.

12. The apparatus of claim 8, wherein the CAM is rewritten for different functions by at least one of the plurality of processing nodes.

13. The apparatus of claim 8, wherein the plurality of processing nodes comprises a first packet processor and a second packet processor, and the CAM stores packet processing rules.

14. A server rack for selectively connecting a plurality of processing nodes, said server rack comprising:
a plurality of servers;
a core comprising a memory lookup structure, the plurality of processing nodes, and a connection matrix, wherein the connection matrix; and
a connector panel connected to the plurality of servers and to the core to provide electrical paths between the plurality of servers and the plurality of processing nodes in the core,
the connection matrix connected to the memory lookup structure via a first data bus, the connection matrix connected to each of the processing nodes of the plurality of processing nodes via a respective data bus, the connection matrix selectively providing directly connected electrical paths between the memory lookup structure and any of the processing nodes in response to the connection matrix receiving control inputs,
wherein the connection matrix, in response to receiving first control inputs, establishes first electrical paths comprising:
an electrical path between the memory lookup structure and a first processing node among the plurality of processing nodes; and
an electrical path between a second processing node among of the plurality of processing nodes and one of the plurality of servers via the connector panel.

15. The server rack of claim 14, further comprising, subsequent to establishing the first electrical paths, storing new data in the memory lookup structure.

16. The server rack of claim 14, wherein the connection matrix receives control inputs from a computer system separate from the plurality of servers.

17. The server rack of claim 14, wherein the memory lookup structure is a content-addressable memory (CAM).

18. The server rack of claim 14, wherein packet processing rules are programmed into the memory lookup structure by at least one of the plurality of processing nodes.

19. The server rack of claim 14, wherein the memory lookup structure is rewritten for different functions by at least one of the plurality of processing nodes.

20. The server rack of claim 14, wherein the connection matrix, in response to receiving second control inputs, disconnects the first electrical paths and establishes second electrical paths comprising:
- an electrical path between the memory lookup structure and a third processing node among the plurality of processing nodes; and
- an electrical path between a fourth processing node among of the plurality of processing nodes and one of the plurality of servers via the connector panel.

* * * * *